(12) United States Patent
Hong et al.

(10) Patent No.: US 12,345,770 B2
(45) Date of Patent: Jul. 1, 2025

(54) BATTERY DIAGNOSIS METHOD AND BATTERY SYSTEM APPLYING THE SAME

(71) Applicant: LG ENERGY SOLUTION, LTD., Seoul (KR)

(72) Inventors: Sung Ju Hong, Daejeon (KR); Geon Choi, Daejeon (KR); Dong Hyun Kim, Daejeon (KR); Hyo Seong An, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/277,699

(22) PCT Filed: Oct. 12, 2022

(86) PCT No.: PCT/KR2022/015415
§ 371 (c)(1),
(2) Date: Aug. 17, 2023

(87) PCT Pub. No.: WO2023/075219
PCT Pub. Date: May 4, 2023

(65) Prior Publication Data

US 2024/0133965 A1 Apr. 25, 2024
US 2024/0230775 A9 Jul. 11, 2024

(30) Foreign Application Priority Data

Oct. 28, 2021 (KR) .................. 10-2021-0145891

(51) Int. Cl.
*G01R 31/389* (2019.01)
*G01R 31/3842* (2019.01)
*G01R 31/396* (2019.01)

(52) U.S. Cl.
CPC ....... *G01R 31/389* (2019.01); *G01R 31/3842* (2019.01); *G01R 31/396* (2019.01)

(58) Field of Classification Search
None
See application file for complete search history.

(56) References Cited

U.S. PATENT DOCUMENTS

2011/0301891 A1 12/2011 Kim
2019/0081369 A1 3/2019 Monden et al.
(Continued)

FOREIGN PATENT DOCUMENTS

CN 109004696 A 12/2018
CN 110911766 A 3/2020
(Continued)

OTHER PUBLICATIONS

International Search Report (PCT/ISA/210) issued in PCT/KR2022/015415, dated Jan. 13, 2023.
(Continued)

*Primary Examiner* — Jas A Sanghera
(74) *Attorney, Agent, or Firm* — Birch, Stewart, Kolasch & Birch, LLP

(57) ABSTRACT

The battery diagnosis method includes calculating, by a battery management system (BMS), a plurality of direct current internal resistances (DCIRs) respectively with respect to a plurality of battery cells based on a plurality of cell voltages and a plurality of cell currents, deriving, by the BMS, an entire representative value of the plurality of DCIRs, calculating, by the BMS, a multi-parallel ideality factor based on a parallel connection number, calculating, by the BMS, a dispersion of the plurality of DCIRs based on the plurality of DCIRs and the entire representative values of the plurality of DCIRs, calculating, by the BMS, an upper limit threshold value of a normal range, and deriving, by the BMS, the normal range based on the upper limit threshold value, and diagnosing a state of a battery pack including the plurality of battery cells according to the normal range.

11 Claims, 7 Drawing Sheets

(56) References Cited

U.S. PATENT DOCUMENTS

| | | |
|---|---|---|
| 2019/0094311 A1 | 3/2019 | Yamada |
| 2019/0204393 A1 | 7/2019 | Yamada |
| 2019/0212397 A1 | 7/2019 | Yamada |
| 2021/0048480 A1 | 2/2021 | Lim et al. |
| 2021/0255250 A1 | 8/2021 | Schmidt |
| 2021/0325477 A1 | 10/2021 | Imade et al. |
| 2022/0155371 A1 | 5/2022 | Kang et al. |
| 2023/0273268 A1* | 8/2023 | Imade .................... B60L 58/18 702/63 |

FOREIGN PATENT DOCUMENTS

| | | |
|---|---|---|
| EP | 3 429 053 A1 | 1/2019 |
| JP | 2008-8703 A | 1/2008 |
| JP | 2016-5288 A | 1/2016 |
| JP | 2018-48884 A | 3/2018 |
| JP | 2018-48893 A | 3/2018 |
| JP | 6571268 B2 | 9/2019 |
| JP | 2020-38125 A | 3/2020 |
| JP | 2020-136247 A | 8/2020 |
| JP | 2021-522486 A | 8/2021 |
| KR | 10-0809453 B1 | 3/2008 |
| KR | 10-2011-0134019 A | 12/2011 |
| KR | 10-1739169 B1 | 5/2017 |
| KR | 10-2019-0013813 A | 2/2019 |
| KR | 10-2019-0046980 A | 5/2019 |
| KR | 10-2019-0123172 A | 10/2019 |
| KR | 10-2021-0058717 A | 5/2021 |
| KR | 10-2022-0060814 A | 5/2022 |

OTHER PUBLICATIONS

Extended European Search Report for European Application No. 22887422.8, dated Sep. 2, 2024.

* cited by examiner

[Figure 1]
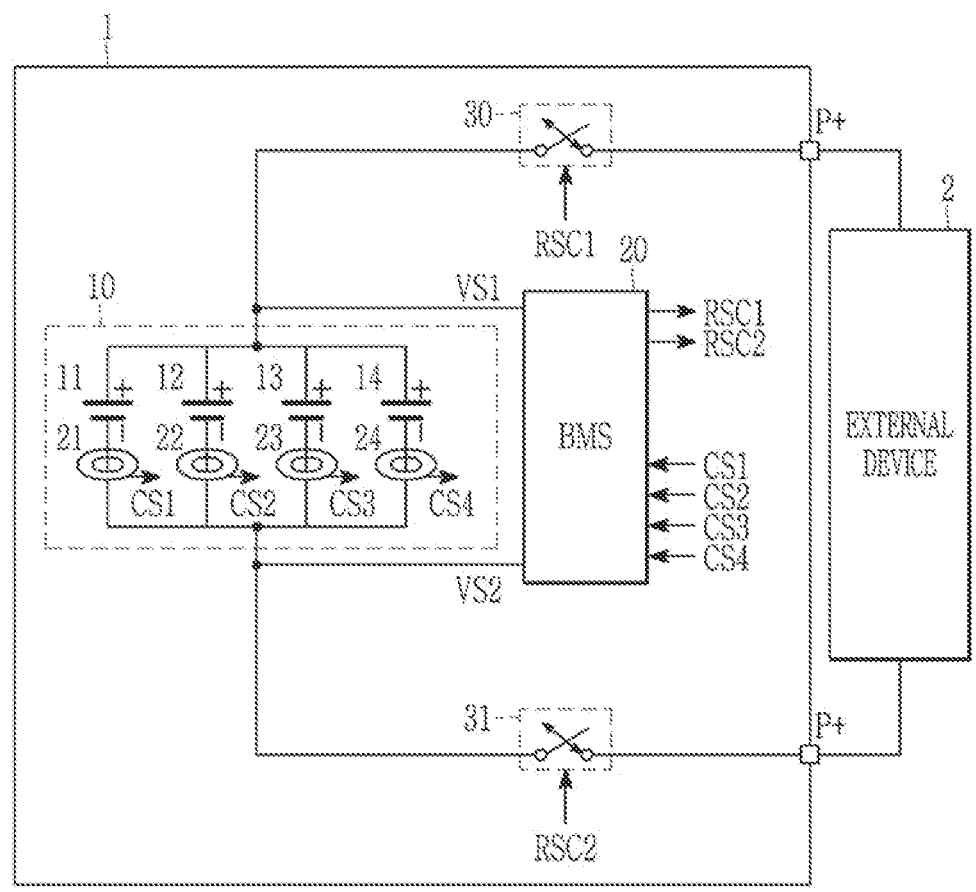

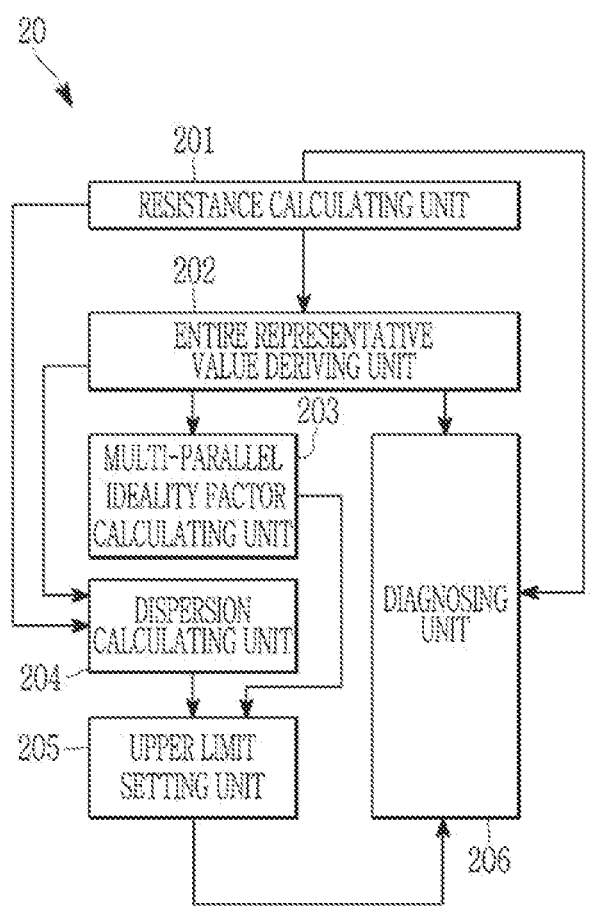
[Figure 2]

[Figure 3]
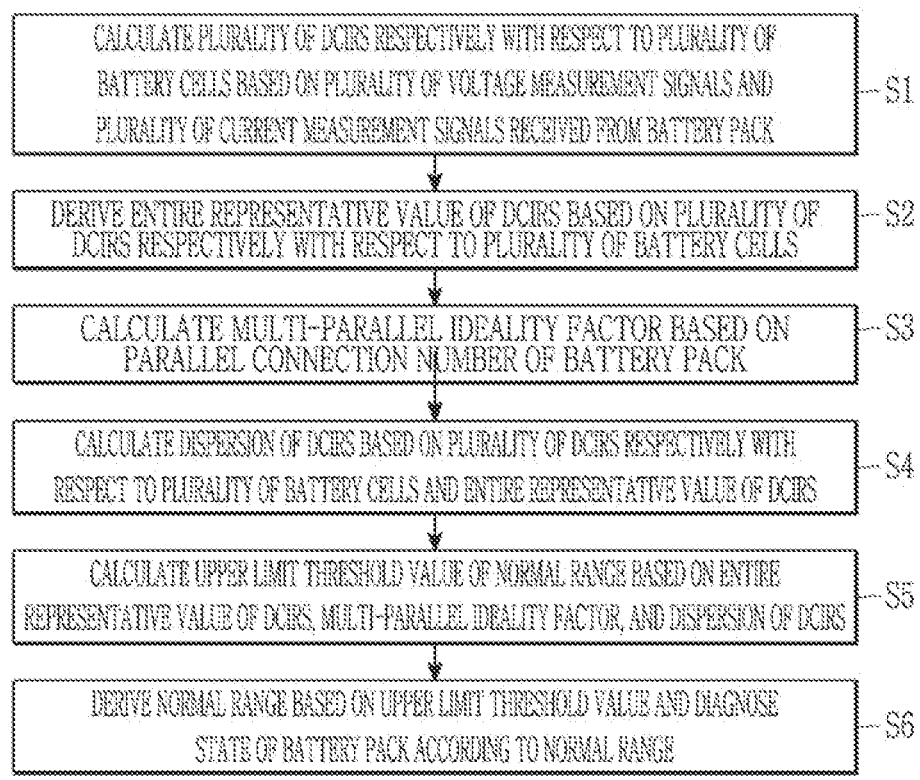

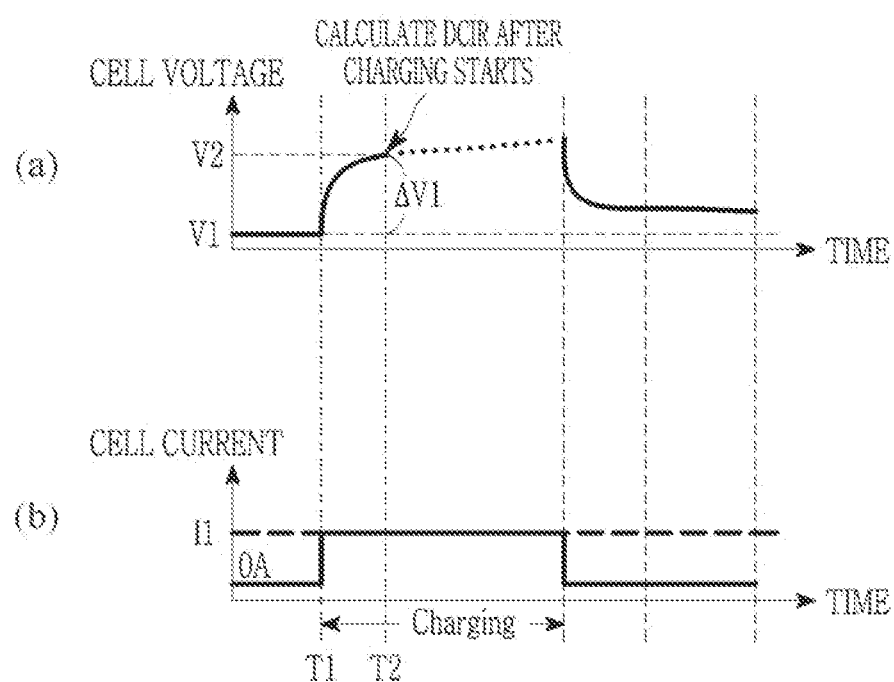
[Figure 4]

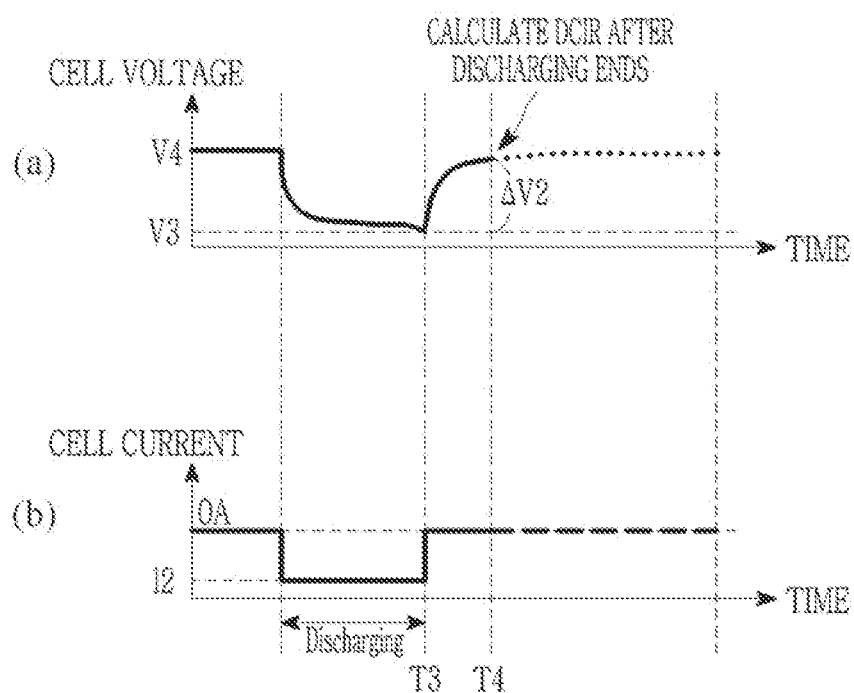
[Figure 5]

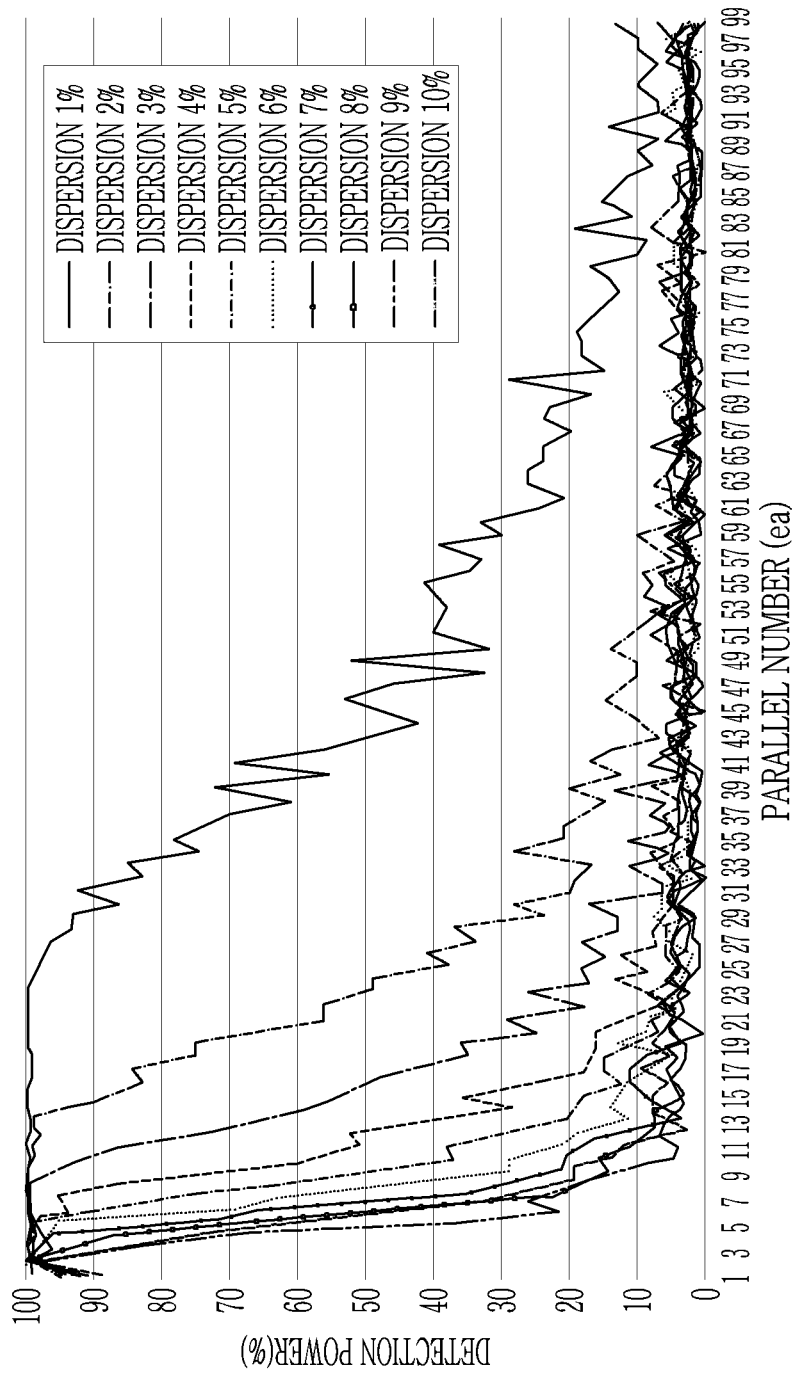
[Figure 6]

[Figure 7]
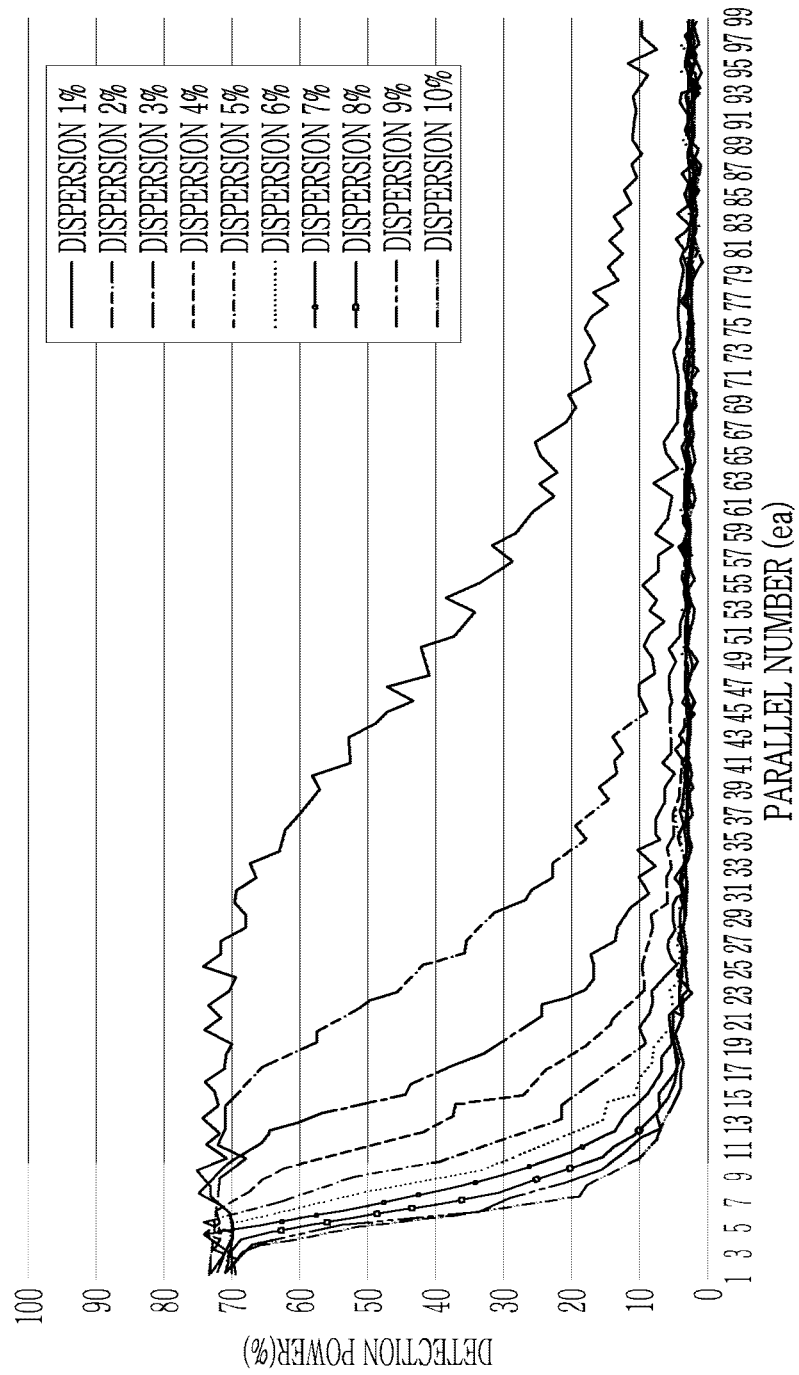

BATTERY DIAGNOSIS METHOD AND BATTERY SYSTEM APPLYING THE SAME

TECHNICAL FIELD

This application claims priority to and the benefit of Korean Patent Application No. 10-2021-0145891 filed in the Korean Intellectual Property Office on Oct. 28, 2021, the entire contents of which are incorporated herein by reference.

The present invention relates to a battery diagnosis method and a battery system applying the battery diagnosis method.

BACKGROUND ART

A battery pack may include a plurality of battery cells connected in series and/or in parallel. As the number of the plurality of battery cells constituting the battery pack increases, the probability that abnormal situations may occur in the plurality of battery cells increases. Abnormal situations that may occur in the plurality of battery cells may include a defect in the battery pack itself, a disconnection between the plurality of battery cells connected in parallel, a current concentration between the plurality of battery cells or a difference in physical connection between other components in the battery pack and the plurality of battery cells, a difference in a degree of degeneration due to the accumulation of thermal imbalance according to positions of the plurality of battery cells, etc.

When the plurality of battery cells are connected in parallel, there may be a limitation in using an abnormality diagnosis method under a condition in which the plurality of battery cells are connected in series.

DISCLOSURE

Technical Problem

The present invention has been made in an effort to provide a battery diagnosis method of a high accuracy by which a battery pack in which a plurality of battery cells are connected in multi-parallel may detect abnormalities of the plurality of battery cells based on a direct current internal resistance (DCIR) value of each of the plurality of battery cells.

Technical Solution

According to an embodiment of the present invention, a battery diagnosis method includes calculating, by a battery management system (BMS), a plurality of direct current internal resistances (DCIRs) respectively with respect to a plurality of battery cells based on a plurality of cell voltages and a plurality of cell currents respectively with respect to the plurality of battery cells connected in parallel, deriving, by the BMS, an entire representative value of the plurality of DCIRs based on the plurality of DCIRs, calculating, by the BMS, a multi-parallel ideality factor based on a parallel connection number, the parallel connection number being a number of the plurality of battery cells connected in parallel, calculating, by the BMS, a dispersion of the plurality of DCIRs based on the plurality of DCIRs and the entire representative values of the plurality of DCIRs, calculating, by the BMS, an upper limit threshold value of a normal range based on the entire representative value of the plurality of DCIRs, the multi-parallel ideality factor, and the dispersion of the plurality of DCIRs, and deriving, by the BMS, the normal range based on the upper limit threshold value, and diagnosing a state of a battery pack including the plurality of battery cells according to the normal range.

The deriving of the entire representative value of the plurality of DCIRs includes deriving, by the BMS, a median value of the plurality of DCIRs as the entire representative value.

The calculating of the upper limit threshold value includes setting, by the BMS, as a target group, a plurality of first battery cells each having a DCIR equal to or less than the entire representative value of the plurality of DCIRs among the plurality of battery cells, deriving, by the BMS, a target representative value of the plurality of DCIRs of the plurality of first battery cells belonging to the target group, and calculating, by the BMS, the upper limit threshold value of the normal range based on the target representative value, the multi-parallel ideality factor, and the dispersion of the plurality of DCIRs.

The deriving of the target representative value of the plurality of DCIRs of the plurality of first battery cells includes deriving, by the BMS, an average value of the plurality of DCIRs of the plurality of first battery cells as the target representative value.

The calculating of the upper limit threshold value includes multiplying the target representative value by a value obtained by subtracting the dispersion of the plurality of DCIRs from the multi-parallel ideality factor.

According to another embodiment of the present invention, a battery system includes a battery pack including a plurality of battery cells connected in parallel, and a battery management system (BMS) configured to calculate a plurality of direct current internal resistances (DCIRs) respectively with respect to the plurality of battery cells based on a plurality of cell voltages and a plurality of cell currents respectively with respect to the plurality of battery cells, calculate an entire representative value of the plurality of DCIRs, a multi-parallel ideality factor, and a dispersion of the plurality of DCIRs based on the plurality of DCIRs and a parallel connection number which is a number of the plurality of battery cells connected in parallel, calculate an upper limit threshold value of a normal range based on the entire representative value of the plurality of DCIRs, the multi-parallel ideality factor, and the dispersion of the plurality of DCIRs, derive the normal range based on the upper limit threshold value, and diagnose a state of the battery pack according to the normal range.

The BMS includes a resistance calculating unit configured to calculate the plurality of DCIRs based on the plurality of cell voltages and the plurality of cell currents, an entire representative value deriving unit configured to derive the entire representative value of the plurality of DCIRs based on the plurality of DCIRs, a multi-parallel ideality factor calculating unit configured to calculate the multi-parallel ideality factor based on the parallel connection number, a dispersion calculating unit configured to calculate the dispersion of the plurality of DCIRs based on the plurality of DCIRs and the entire representative value of the plurality of DCIRs, an upper limit threshold value of the normal range based on the entire representative value of the plurality of DCIRs, the multi-parallel ideality factor, and the dispersion of the plurality of DCIRs, and a diagnosing unit configured to derive the normal range based on the upper limit threshold value, and diagnose the state of the battery pack according to the normal range.

The entire representative value deriving unit derives a median value of the plurality of DCIRs as the entire representative value.

The upper limit setting unit sets, as a target group, a plurality of first battery cells each having a DCIR equal to or less than the entire representative value of the plurality of DCIRs among the plurality of battery cells, derives a target representative value of the plurality of DCIRs of the plurality of first battery cells belonging to the target group, and calculates the upper limit threshold value of the normal range based on the target representative value, the multi-parallel ideality factor, and the dispersion of the plurality of DCIRs.

The upper limit setting unit derives an average value of the plurality of DCIRs of the plurality of first battery cells as the target representative value.

The upper limit setting unit calculates the upper limit threshold value by multiplying the target representative value by a value obtained by subtracting the dispersion of the plurality of DCIRs from the multi-parallel ideality factor.

Advantageous Effects

A battery pack in which a plurality of battery cells are connected in multi-parallel may detect abnormalities of the plurality of battery cells based on an DCIR value of each of the plurality of battery cells, thereby allowing a battery diagnosis of a high accuracy.

DESCRIPTION OF THE DRAWINGS

FIG. 1 is a diagram illustrating a battery system according to an embodiment.

FIG. 2 is a block diagram schematically illustrating a connection relationship of a detailed configuration of a battery management system.

FIG. 3 is a flowchart illustrating a battery diagnosis method according to an embodiment.

FIG. 4 is a waveform diagram illustrating changes in a battery cell voltage and a cell current flowing through a battery cell according to charging of a battery pack.

FIG. 5 is a waveform diagram illustrating changes in a battery cell voltage and a cell current flowing through a battery cell according to discharging of a battery pack.

FIG. 6 is a diagram illustrating an example of a simulation result regarding anomaly detection power when using a multi-parallel ideality factor in consideration of dispersion according to an embodiment.

FIG. 7 is a diagram illustrating an example of a simulation result regarding anomaly detection power according to a method that does not consider dispersion as a comparative example.

MODE FOR INVENTION

Hereinafter, the embodiments disclosed in the present specification will be described in detail with reference to the accompanying drawings, but same or similar components are given the same or similar reference numerals, and redundant descriptions thereof will be omitted. The suffixes "module" and/or "part" for components used in the following description are given or mixed in consideration of only the ease of drafting the specification, and do not have meanings or roles distinct from each other by themselves. In addition, in describing the embodiments disclosed in the present specification, when it is determined that detailed descriptions of related known technologies may obscure the gist of the embodiments disclosed in the present specification, the detailed description thereof will be omitted. In addition, the accompanying drawings are only for easy understanding of the embodiments disclosed in the present specification, do not limit the technical idea disclosed in the present specification, and should be understood to include all changes, equivalents or substitutes included in the spirit and scope of the present disclosure.

The terms including an ordinal number, such as first, second, etc., may be used to describe various components, but the components are not limited by the terms. These terms are used only for the purpose of distinguishing one component from another.

It will be further understood that the terms "comprises" and/or "comprising," when used in the present specification, specify the presence of stated features, integers, steps, operations, components, and/or parts, but do not preclude the presence or addition of one or more other features, integers, steps, operations, components, parts, and/or combinations thereof.

A program implemented as a set of instructions embodying a control algorithm necessary to control another configuration may be installed in a configuration controlling another configuration under a specific control condition among configurations according to an embodiment. The control configuration may process input data and stored data according to the installed program to generate output data. The control configuration may include a non-volatile memory to store a program and a memory to store data.

Hereinafter, a method of diagnosing a battery in consideration of a multi-parallel ideality factor and a dispersion and a battery system applying the method according to an embodiment will be described with reference to the drawings. The method of diagnosing a battery in consideration of a multi-parallel ideality factor and a dispersion may be implemented as software installed in a battery management system or a program including a combination of software. The corresponding program may be stored in a storage medium of the battery management system. The storage medium may be implemented as various types of memory, such as high-speed random access memory, flash memory device, non-volatile memory such as other non-volatile solid-state memory devices, etc.

FIG. 1 is a diagram illustrating a battery system according to an embodiment.

A battery system 1 includes a battery pack 10, a battery management system 20, and relays 30 and 31. Hereinafter, the battery management system 20 is referred to as a BMS. FIG. 1 shows that the number of the battery pack 10 is one, but the invention is not limited thereto, and the battery system 1 may include two or more battery packs.

An external device 2 may include a load such as an inverter and a converter and a charging device. When the external device 2 is a charger, both ends of the battery system 1 may be connected to the charger, receive power from the charger, and be charged. When the external device 2 is a load, both ends of the battery system 1 may be connected to the load so that power supplied by the battery pack 10 may be discharged through the load.

The battery pack 10 includes a plurality of battery cells 11 to 14 and a plurality of current sensors 21 to 24. The plurality of battery cells 11 to 14 is connected in parallel to each other. Each (e.g., 21) of the plurality of current sensors 21 to 24 may measure a current flowing through the corresponding battery cell (e.g., 11) among the plurality of battery cells 11 to 14. For example, as shown in FIG. 1, the plurality of current sensors 21 to 24 may be implemented as Hall sensors, and each of the plurality of current sensors 21 to 24 may be positioned to sense a current of the corresponding battery cell. FIG. 1 shows that the number of the plurality of battery cells 11 to 14 is four, but the invention is not limited thereto, and the battery pack 10 may be implemented as a plurality of battery cells in which two or more battery cells connected in parallel or two or more battery cells connected in series are connected in parallel. The number of the plurality of current sensors 21 to 24 is shown as four, but the invention is not limited thereto, and may increase or decrease according to the number of the plurality of battery cells.

Each (e.g., 21) of the plurality of current sensors 21 to 24 may measure a current flowing on a wiring connected to a negative electrode of the corresponding battery cell (e.g., 11) among the plurality of battery cells 11 to 14, and transmit a corresponding current measurement signal CS1 among a plurality of current measurement signals CS1 to CS4 to the BMS 20. FIG. 1 shows that the plurality of current sensors 21-24 are respectively positioned on wirings connected to negative electrodes of the plurality of battery cells 11 to 14, but the invention is not limited thereto, and may be positioned on wirings connected to positive electrodes of the plurality of battery cells 11 to 14.

When the battery pack 10 is charged or discharged by the external device 2, the BMS 20 may calculate a direct current internal resistance (DCIR) value of each of the plurality of battery cells 11 to 14, a multi-parallel ideality factor, and a dispersion of DCIRs, derive a normal range of DCIRs based on the multi-parallel ideality factor and the dispersion, and diagnose a state of the battery pack 10 through the normal range.

One end (e.g., a first end) of each of the relays 30 and 31 is connected to the battery pack 10, and the other end (e.g., a second end) of each of the relays 30 and 31 is connected to at least one component in the external device 2. The closing and opening of the relays 30 and 31 are controlled according to relay control signals RSC1 and RSC2 supplied from the BMS 20.

The BMS 20 is connected to both ends of the battery pack 10 and obtains a plurality of voltage measurement signals VS1 and VS2 measured from both ends of the battery pack 10 through an input terminal. For example, the voltage measurement signal VS1 is a signal indicating the positive voltage of the battery pack 10, and the voltage measurement signal VS2 is a signal indicating the negative voltage of the battery pack 10. The pack voltage of the battery pack 10 derived from the plurality of voltage measurement signals VS1 and VS2 may be the same as the cell voltage of each of the plurality of battery cells 11 to 14.

The BMS 20 obtains the corresponding current measurement signal (e.g., CS1) from among the plurality of current measurement signals CS1 to CS4 from each (e.g., 21) of the plurality of current sensors 21 to 24. For example, the current measurement signal CS1 is a signal representing the current of the battery cell 11.

The internal configuration of the battery system 1 may be formed on a board.

FIG. 2 is a block diagram schematically illustrating a connection relationship of a detailed configuration of a battery management system.

The BMS 20 may include a resistance calculating unit 201, an entire representative value deriving unit 202, a multi-parallel ideality factor calculating unit 203, a dispersion calculating unit 204, an upper limit setting unit 205, and a diagnosing unit 206.

Hereinafter, the operation of each component of the BMS 20 for diagnosing the state of the battery pack 10 will be sequentially described according to a flowchart shown in FIG. 3.

FIG. 3 is a flowchart illustrating a battery diagnosis method according to an embodiment.

The resistance calculating unit 201 calculates a plurality of DCIRs respectively with respect to the plurality of battery cells 11 to 14 from the plurality of voltage measurement signals VS1 and VS2 and the plurality of current measurement signals CS1 to CS4 received from the battery pack 10 (S1).

Hereinafter, referring to [Equation 1], the resistance calculating unit 201 may calculate the plurality of DCIRs respectively with respect to the plurality of battery cells 11 to 14 based on a voltage differences ΔV of both sides of each of the plurality of battery cells 11 to 14 and the current flowing through each of plurality of battery cells 11 to 14.

$$DCIR_i = \frac{\Delta V}{I_i} \qquad \text{[Equation 1]}$$

DCIR indicates a DCIR [Ω] of each of the plurality of battery cells 11 to 14. i indicates an index indicating each battery cell, and may be a natural number equal to or greater than 1 and equal to or less than n. n may be the total number (e.g., 4) of a plurality of battery cells included in the battery pack 10. I is a charging current or a discharging current [mA] with respect to the plurality of battery cells 11 to 14. ΔV indicates a voltage difference [mV] of the plurality of battery cells 11 to 14 that occurs according to charging or discharging.

The voltage difference ΔV may be derived by a method of deriving at least one of a voltage difference ΔV1 before and after the battery pack 10 starts charging by a charging device and a voltage difference ΔV2 before and after the battery pack 10 ends discharging by a load.

The current I may be derived by a method of deriving at least one of a charging current I1 flowing through the corresponding battery cell (e.g., 11) among the plurality of battery cells 11 to 14 while the battery pack 10 is being charged by the charging device and a discharge current I2 flowing through the corresponding battery cell (e.g., 11) among the plurality of battery cells 11 to 14 while the battery pack 10 is being discharged by the load.

Hereinafter, a process in which the resistance calculating unit 201 calculates the DCIR of a battery cell will be described with reference to FIGS. 4 and 5.

FIG. 4 is a waveform diagram illustrating changes in a battery cell voltage and a cell current flowing through a battery cell according to charging of a battery pack.

FIG. 5 is a waveform diagram illustrating changes in a battery cell voltage and a cell current flowing through a battery cell according to discharging of a battery pack.

As shown in FIG. 4, cell voltages of the plurality of battery cells 11 to 14 may increase by charging of the battery pack 10. In FIG. 4, waveform diagram (a) shows the behavior of the cell voltage of one (e.g., 11) of the plurality of battery cells 11 to 14 over time, and waveform diagram (b) shows the cell current flowing through the battery cell 11 over time.

As shown in FIG. 5, cell voltages of the plurality of battery cells 11 to 14 may decrease due to discharging of the battery pack 10. In FIG. 5, waveform diagram (a) shows the behavior of the cell voltage of one (e.g., 11) of the plurality of battery cells 11 to 14 over time, and waveform diagram (b) shows the cell current flowing through the battery cell 11 over time.

When the battery pack 10 is charged by the charging device, the resistance calculating unit 201 may derive the voltage difference ΔV1 indicating a variation of the battery cell voltage due to charging of the battery pack 10 from the plurality of voltage measurement signals VS1 and VS2.

Referring to FIG. 4, the resistance calculating unit 201 may be synchronized with a time T1 at which charging of the plurality of battery cells 11 to 14 starts and may derive a cell voltage V1 indicating a voltage difference of both ends of the battery cell from the plurality of voltage measurement signals VS1 and VS2. The resistance calculating unit 201 may be synchronized with a time T2 at which a stabilization period elapses after the charging of the plurality of battery cells 11 to 14 starts and may derive a battery cell voltage V2 from the plurality of voltage measurement signals VS1 and VS2.

The resistance calculating unit 201 may calculate a difference V2-V1 between the battery cell voltage at the time T1 and the battery cell voltage at the time T2, and calculate the voltage difference ΔV1 indicating the variation in the battery cell voltage due to charging.

The resistance calculating unit 201 may derive a cell current from the corresponding current measurement signal (e.g., CS1) among the plurality of current measurement signals CS1 to CS4. The magnitude of the cell current (e.g., I1) during charging may be controlled to be constant. The resistance calculating unit 201 may calculate the DCIR of each of the plurality of battery cells 11 to 14 based on the voltage difference ΔV1 and the cell current I1. For example, the resistance calculating unit 201 may calculate the DCIR of the battery cell 11 as ΔV1/I1.

Alternatively, when the battery pack 10 is discharged by a load, the resistance calculating unit 201 may derive a voltage difference ΔV2 indicating a variation of the battery cell voltage due to discharging of the battery pack 10 from the plurality of voltage measurement signals VS1 and VS2.

Referring to FIG. 5, the resistance calculating unit 201 may be synchronized with a time T3 at which discharging of the plurality of battery cells 11 to 14 ends and may derive a cell voltage V3 indicating a voltage difference of both ends of the battery cell from the plurality of voltage measurement signals VS1 and VS2. The resistance calculating unit 201 may be synchronized with a time T4 at which a stabilization period elapses after discharging of the plurality of battery cells 11 to 14 ends and may derive a cell voltage V4 from the plurality of voltage measurement signals VS1 and VS2.

The resistance calculating unit 201 may calculate a difference V4-V3 between the battery cell voltage at the time T3 and the battery cell voltage at the time T4 and calculate the voltage difference ΔV2 indicating the variation of the battery cell voltage due to discharging.

The resistance calculating unit 201 may derive a cell current from the corresponding current measurement signal (e.g., CS1) among the plurality of current measurement signals CS1 to CS4. The magnitude of the cell current I2 during discharge may be controlled to be constant. The resistance calculating unit 201 may calculate the DCIR of each of the plurality of battery cells 11 to 14 based on the voltage difference ΔV2 and the cell current I2. For example, the resistance calculating unit 201 may calculate the DCIR of the battery cell 11 as ΔV2/I2.

The entire representative value deriving unit 202 derives an entire representative value of DCIRs based on a plurality of DCIRs respectively with respect to the plurality of battery cells 11 to 14 (S2).

As a method of deriving the entire representative value of DCIRs, a method of deriving a median value, an average value, etc. of DCIR values of all the plurality of battery cells may be used. Hereinafter, it will be described that the entire representative value of DCIRs is the median value of the DCIR values respectively with respect to the plurality of battery cells 11 to 14.

The entire representative value deriving unit 202 aligns the DCIR values respectively with respect to the plurality of battery cells 11 to 14 in the order of the magnitude of resistance. Among the aligned DCIR values, a central value may be derived as the entire representative value.

For example, when the number of battery cells is 2m (m is a natural number), and when 2m resistance values are aligned in the order of magnitude, the representative value deriving unit 202 may derive an m-th resistance value in the alignment order as the entire representative value. Alternatively, when the number of battery cells is 2m-1 (m is a natural number), and when 2m-1 resistance values are aligned in the order of magnitude, the representative value deriving unit 202 may derive the m-th resistance value or an m-1th resistance value in the alignment order as the entire representative value.

The multi-parallel ideality factor calculating unit 203 calculates a multi-parallel ideality factor based on a parallel connection number of the battery pack 10 (S3).

A unit module constituting the battery pack 10 may include at least one battery cell. When the number of battery cells in the unit module is two or more, the battery cells in one unit module may be connected in series. FIG. 1 shows that the unit module includes one battery cell, but the invention is not limited thereto. That is, the battery pack 10 may include a plurality of unit modules connected in parallel, and the unit modules may include two or more battery cells connected in series, unlike that shown in FIG. 1. Hereinafter, the parallel connection number of the battery pack 10 may refer not only to the number of a plurality of battery cells connected in parallel as shown in FIG. 1 but also to the number of a plurality of unit modules connected in parallel constituting the battery pack.

In the example of FIG. 1, since the plurality of battery cells 11 to 14 are connected in parallel, the multi-parallel ideality factor calculator 203 may determine the parallel connection number of the battery pack 10 to be four.

Hereinafter, referring to [Equation 2], the multi-parallel ideality factor calculator 203 may derive a multi-parallel ideality factor based on the parallel connection number of the battery pack 10.

$$\mu = \frac{P}{P-1} \quad \text{[Equation 2]}$$

μ indicates the multi-parallel ideality factor. P indicates the parallel connection number. Based on [Equation 2], when P is 1, μ is infinity, and thus, the battery system 1 may be applied when the parallel connection number is two or more. In the example of FIG. 1, because the parallel connection number is four, μ is 4/3=1.333.

The dispersion calculating unit 204 calculates the dispersion of DCIRs based on the plurality of DCIRs respectively with respect to the plurality of battery cells and the entire representative value of DCIRs (S4).

The dispersion may be calculated in a general method. For example, the dispersion calculating unit 204 may calculate the dispersion based on a plurality of deviations between the entire representative value of DCIRs and each of the plurality of DCIRs. The dispersion calculating unit 204 may calculate a value obtained by adding all the plurality of deviations between the entire representative value of DCIRs and each of the plurality of DCIRs or a root mean square (RMS) of the plurality of deviations as the dispersion.

Hereinafter, referring to [Equation 3], the dispersion calculating unit 204 may calculate the value obtained by adding all the plurality of deviations between the plurality of DCIRs and the entire representative value of DCIRs as the dispersion.

$$d = \sum_{i=1}^{n} IA_i - X(A_i) \qquad \text{[Equation 3]}$$

d indicates the dispersion of DCIRs. A indicates the DCIR of the battery cell. i indicates an index indicating each battery cell, and may be a natural number equal to or greater than 1 and equal to or less than n. n may be the total number of a plurality of battery cells included in the battery pack 10. X(A) indicates the entire representative value of A.

The upper limit setting unit 205 may calculate the upper limit threshold value of the normal range based on the entire representative value of DCIRs, the multi-parallel ideality factor, and the dispersion of DCIRs (S5).

The normal range may be a range of DCIR of a battery cell falling within a normally operable range among the plurality of battery cells 11 to 14. A battery cell having DCIR that does not fall within the normal range may be considered to be in an anomaly detection region.

In an embodiment, the upper limit threshold value may be calculated using the entire representative value of DCIRs and the multi-parallel ideality factor as well as the dispersion of DCIRs as determination factors so that a part that may not belong to the abnormality detection region due to the dispersion of the plurality of DCIRs may belong to the abnormality detection region.

Hereinafter, a step in which the upper limit setting unit 205 calculates the upper limit threshold value of the normal range based on the entire representative value of DCIRs, the multi-parallel ideality factor, and the dispersion of DCIRs will be described in detail.

First, the upper limit setting unit 205 may set, as a target group, battery cells having a DCIR that is less than or equal to the entire representative value of DCIRs among the plurality of DCIRs respectively with respect to the plurality of battery cells 11 to 14.

The upper limit setting unit 205 may derive a target representative value of DCIR values of the battery cells belonging to the target group.

As a method of deriving the target representative value, a method of deriving a median value, an average value, etc. of the DCIR values of the battery cells belonging to the target group may be used. Hereinafter, it will be described that the target representative value of DCIRs is the average value of the DCIR values respectively with respect to the battery cells belonging to the target group.

Hereinafter, referring to [Equation 4], the upper limit setting unit 205 may calculate the upper limit threshold value by multiplying the target representative value derived as the average value of the DCIR values respectively with respect to the battery cells belonging to the target group by a difference between the multi-parallel ideality factor and the dispersion.

$$\text{Upper} = X_T(T(A)) * (\mu - d) = X_T(T(A)) * \left(\frac{P}{P-1} - d\right) \qquad \text{[Equation 4]}$$

Upper indicates the upper limit threshold value of the normal range. A indicates the DCIR of the battery cell. T(A) indicates the DCIRs of the battery cells belonging to the target group. $X_T(T(A))$ indicates the target representative value of A. μ indicates the multi-parallel ideality factor. d indicates the dispersion of DCIRs. P indicates the parallel connection number.

For example, $X_T(T(A))$ may be an average value of the DCIRs of the battery cells T(A) belonging to the target group.

The diagnosing unit 206 may derive a normal range based on the upper limit threshold value and diagnose a state of the battery pack 10 according to the normal range (S6).

The normal range may have the calculated upper limit threshold value.

When the normal range has the upper limit threshold value, the diagnosing unit 206 may derive a range in which the DCIR of the battery cell is equal to or less than the upper limit threshold value as the normal range. Also, the diagnosing unit 206 may derive an area in which the DCIR value of the battery cell exceeds the upper limit threshold as the abnormality detection region.

The diagnosing unit 206 may diagnose the state of the battery pack 10 by distinguishing whether each of the plurality of battery cells 11 to 14 included in the battery pack 10 belongs to the normal range or the abnormal detection region.

Hereinafter, a difference in the abnormality detection power capable of detecting an abnormal battery cell through an abnormality detection region according to whether to apply the battery diagnosis method according to an embodiment and the battery system applying the battery diagnosis method is applied will be described with reference to FIGS. 6 and 7.

FIG. 6 is a diagram illustrating an example of a simulation result regarding anomaly detection power when using a multi-parallel ideality factor in consideration of dispersion according to an embodiment.

FIG. 7 is a diagram illustrating an example of a simulation result regarding anomaly detection power according to a method that does not consider dispersion as a comparative example.

FIG. 6 shows the detection power according to the parallel connection number when the battery diagnosis method according to an embodiment is applied. The x-axis indicates the parallel connection number, and the unit thereof is the number. The y-axis indicates the detection power, and the unit thereof is %.

FIG. 7 shows the detection power according to the parallel connection number when the battery diagnosis method according to an embodiment is not applied. The x-axis indicates the parallel connection number, and the unit thereof is the number. The y-axis indicates the detection power, and the unit thereof is %.

When the dispersion is 1%, in FIG. 6, the detection power is maintained at a level of about 100% from the parallel connection number of 1 to about 25, and then according to an increase in the parallel connection number, the detection power decreases. In FIG. 7, the detection power is maintained at a level of about 70% from the parallel connection number of 1 to about 25, and then according to an increase in the parallel connection number, the detection power decreases.

Referring to the simulation results shown in FIGS. 6 and 7, it may be seen that the abnormality detection power is improved under the condition in which a dispersion value is considered in the upper limit threshold of the normal range, compared to the condition in which the dispersion value is not considered.

Although the embodiments of the present invention have been described in detail above, the scope of the present invention is not limited thereto, and various modifications and improvements made by those of ordinary skill in the field to which the present invention pertains also belong to the scope of the present invention.

The invention claimed is:

1. A battery diagnosis method comprising:
calculating, by a battery management system (BMS), a plurality of direct current internal resistances (DCIRs) respectively with respect to a plurality of battery cells based on a plurality of cell voltages and a plurality of cell currents respectively with respect to the plurality of battery cells connected in parallel;
deriving, by the BMS, an entire representative value of the plurality of DCIRs based on the plurality of DCIRs;
calculating, by the BMS, a multi-parallel ideality factor based on a parallel connection number, the parallel connection number being a number of the plurality of battery cells connected in parallel;
calculating, by the BMS, a dispersion of the plurality of DCIRs based on the plurality of DCIRs and the entire representative values of the plurality of DCIRs;
calculating, by the BMS, an upper limit threshold value of a normal range based on the entire representative value of the plurality of DCIRs, the multi-parallel ideality factor, and the dispersion of the plurality of DCIRs; and
deriving, by the BMS, the normal range based on the upper limit threshold value, and diagnosing a state of a battery pack including the plurality of battery cells according to the normal range.

2. The battery diagnosis method of claim 1, wherein:
the deriving of the entire representative value of the plurality of DCIRs includes deriving, by the BMS, a median value of the plurality of DCIRs as the entire representative value.

3. The battery diagnosis method of claim 1, wherein:
the calculating of the upper limit threshold value includes:
setting, by the BMS, as a target group, a plurality of first battery cells each having a DCIR equal to or less than the entire representative value of the plurality of DCIRs among the plurality of battery cells;
deriving, by the BMS, a target representative value of the plurality of DCIRs of the plurality of first battery cells belonging to the target group, and
calculating, by the BMS, the upper limit threshold value of the normal range based on the target representative value, the multi-parallel ideality factor, and the dispersion of the plurality of DCIRs.

4. The battery diagnosis method of claim 3, wherein:
the deriving of the target representative value of the plurality of DCIRs of the plurality of first battery cells includes:
deriving, by the BMS, an average value of the plurality of DCIRs of the plurality of first battery cells as the target representative value.

5. The battery diagnosis method of claim 3, wherein:
the calculating of the upper limit threshold value includes multiplying the target representative value by a value obtained by subtracting the dispersion of the plurality of DCIRs from the multi-parallel ideality factor.

6. A battery system comprising:
a battery pack including a plurality of battery cells connected in parallel; and
a battery management system (BMS) configured to:
calculate a plurality of direct current internal resistances (DCIRs) respectively with respect to the plurality of battery cells based on a plurality of cell voltages and a plurality of cell currents respectively with respect to the plurality of battery cells,
calculate an entire representative value of the plurality of DCIRs, a multi-parallel ideality factor, and a dispersion of the plurality of DCIRs based on the plurality of DCIRs and a parallel connection number which is a number of the plurality of battery cells connected in parallel,
calculate an upper limit threshold value of a normal range based on the entire representative value of the plurality of DCIRs, the multi-parallel ideality factor, and the dispersion of the plurality of DCIRs,
derive the normal range based on the upper limit threshold value, and
diagnose a state of the battery pack according to the normal range.

7. The battery system of claim 6, wherein: the BMS includes:
a resistance calculating unit configured to calculate the plurality of DCIRs based on the plurality of cell voltages and the plurality of cell currents;
an entire representative value deriving unit configured to derive the entire representative value of the plurality of DCIRs based on the plurality of DCIRs;
a multi-parallel ideality factor calculating unit configured to calculate the multi-parallel ideality factor based on the parallel connection number;
a dispersion calculating unit configured to calculate the dispersion of the plurality of DCIRs based on the plurality of DCIRs and the entire representative value of the plurality of DCIRs;
an upper limit setting unit configured to calculate the upper limit threshold value of the normal range based on the entire representative value of the plurality of DCIRs, the multi-parallel ideality factor, and the dispersion of the plurality of DCIRs; and
a diagnosing unit configured to derive the normal range based on the upper limit threshold value, and diagnose the state of the battery pack according to the normal range.

8. The battery system of claim 7, wherein:
the entire representative value deriving unit is configured to derive a median value of the plurality of DCIRs as the entire representative value.

9. The battery system of claim 7, wherein:
the upper limit setting unit is configured to set, as a target group, a plurality of first battery cells each having a DCIR equal to or less than the entire representative value of the plurality of DCIRs among the plurality of battery cells, derive a target representative value of the plurality of DCIRs of the plurality of first battery cells belonging to the target group, and calculate the upper limit threshold value of the normal range based on the target representative value, the multi-parallel ideality factor, and the dispersion of the plurality of DCIRs.

10. The battery system of claim 9, wherein:
the upper limit setting unit is configured to:
derive an average value of the plurality of DCIRs of the plurality of first battery cells as the target representative value.

11. The battery system of claim 9, wherein:
the upper limit setting unit is configured to calculate the upper limit threshold value by multiplying the target representative value by a value obtained by subtracting the dispersion of the plurality of DCIRs from the multi-parallel ideality factor.

* * * * *